United States Patent
Sambhy et al.

(10) Patent No.: US 11,298,964 B2
(45) Date of Patent: Apr. 12, 2022

(54) IMAGING BLANKET WITH THERMAL MANAGEMENT PROPERTIES

(71) Applicant: XEROX CORPORATION, Norwalk, CT (US)

(72) Inventors: Varun Sambhy, Pittsford, NY (US); Joseph Sheflin, Macedon, NY (US); Peter Knausdorf, Henrietta, NY (US); Mark C. Petropoulos, Webster, NY (US); Jack T. LeStrange, Macedon, NY (US); Santokh S. Badesha, Pittsford, NY (US)

(73) Assignee: XEROX CORPORATION, Norwalk, CT (US)

( * ) Notice: Subject to any disclaimer, the term of this patent is extended or adjusted under 35 U.S.C. 154(b) by 364 days.

(21) Appl. No.: 16/368,744

(22) Filed: Mar. 28, 2019

(65) Prior Publication Data

US 2020/0307293 A1    Oct. 1, 2020

(51) Int. Cl.
| | |
|---|---|
| *B41N 10/04* | (2006.01) |
| *G03F 7/00* | (2006.01) |
| *B41M 1/06* | (2006.01) |
| *B41C 1/10* | (2006.01) |

(52) U.S. Cl.
CPC .............. *B41M 1/06* (2013.01); *B41C 1/10* (2013.01); *B41N 10/04* (2013.01); *G03F 7/0002* (2013.01)

(58) Field of Classification Search
None
See application file for complete search history.

(56) References Cited

U.S. PATENT DOCUMENTS

| | | |
|---|---|---|
| 4,174,244 A | 11/1979 | Thomas et al. |
| 6,289,809 B1 | 9/2001 | Sonobe |
| 6,688,226 B2 | 2/2004 | Rossini et al. |
| 9,950,549 B2 | 4/2018 | Kanungo |
| 2003/0233953 A1 | 12/2003 | Pan et al. |
| 2012/0103212 A1 | 5/2012 | Stowe et al. |

(Continued)

FOREIGN PATENT DOCUMENTS

| | | |
|---|---|---|
| EP | 1428673 A1 | 6/2004 |
| EP | 3248804 A1 | 11/2017 |
| EP | 3285121 A2 | 2/2018 |

OTHER PUBLICATIONS

Author Unknown, "Silicone Rubber Material Specifications," downloaded Jun. 17, 2019 from https://www.exonicpolymers.com/articles.aspID=266, 5 pages.

(Continued)

*Primary Examiner* — Joshua D Zimmerman

(74) *Attorney, Agent, or Firm* — MH2 Technology Law Group LLP

(57) ABSTRACT

Provided herein is an imaging blanket for variable data lithography comprising (i) a substrate and (ii) a thermally-conductive composition disposed on the substrate comprising a silicone elastomer and a thermally-conductive filler selected from metal oxides, wherein the thermally-conductive composition has a thermal conductivity ranging from about 0.6 W/m² to about 1.6 W/m². Further provided herein a method of making the imaging blanket, as well as a printing system comprising the imaging blanket, wherein the imaging blanket has improved thermal conductivity.

16 Claims, 2 Drawing Sheets

(56) References Cited

U.S. PATENT DOCUMENTS

| | | |
|---|---|---|
| 2012/0103216 A1 | 5/2012 | Knisel et al. |
| 2015/0070454 A1* | 3/2015 | Moorlag ............... B41N 10/00 |
| | | 347/103 |
| 2015/0291847 A1 | 10/2015 | Condello et al. |
| 2016/0176185 A1 | 6/2016 | Kanungo et al. |
| 2016/0236500 A1 | 8/2016 | Fu et al. |
| 2017/0015115 A1 | 1/2017 | Chen et al. |
| 2017/0341452 A1* | 11/2017 | Kanungo ............... B41C 1/10 |
| 2018/0050532 A1 | 2/2018 | Stowe et al. |
| 2019/0322114 A1 | 10/2019 | Sambhy et al. |
| 2020/0282759 A1 | 9/2020 | Sambhy et al. |
| 2020/0353770 A1 | 11/2020 | Sambhy et al. |
| 2021/0016590 A1 | 1/2021 | Sambhy et al. |

OTHER PUBLICATIONS

Extended European Search Report dated Dec. 21, 2020 in related European Application No. 20182118.8.
Extended European Search Report dated Oct. 2, 2020 in related European Application No. 201730728.
Lewis et al. "Platinum Catalysts Used in the Silicones Industry," Platinum Metals Rev., 1997, 41 (2), 66-75.
Wikipedia, "Silicone rubber," downloaded Jun. 17, 2019 from https://en.wikipedia.org/wiki/silicone_rubber, 11 pages.
Extended European Search Report dated Sep. 1, 2020 in corresponding European Application No. 20164739.3.
Vogel, Thomas (EP Examiner), Extended European Search Report dated May 25, 2021 in related European Application No. 201182118.8, 15 pages.

* cited by examiner

IMAGING BLANKET WITH THERMAL MANAGEMENT PROPERTIES

DETAILED DESCRIPTION

Field of the Disclosure

This disclosure relates generally to marking and printing systems, and more specifically to an imaging blanket of such a system.

Background

Typical lithographic and offset printing techniques use plates that are permanently patterned and are therefore useful only when printing a large number of copies of the same image (i.e., long print runs), such as magazines, newspapers, and the like. However, they do not permit creating and printing a new pattern from one page to the next without removing and replacing the print cylinder and/or the imaging plate (i.e., the technique cannot accommodate true high speed variable data printing wherein the image changes from impression to impression, for example, as in the case of digital printing systems). Furthermore, the cost of the permanently patterned imaging plates or cylinders is amortized over the number of copies. The cost per printed copy is therefore higher for shorter print runs of the same image than for longer print runs of the same image, as opposed to prints from digital printing systems.

Accordingly, a lithographic technique, referred to as variable data lithography, has been developed which uses an imaging member comprising a non-patterned reimageable surface or imaging blanket that is initially uniformly coated with a dampening fluid layer. Regions of the dampening fluid are removed by exposure to a focused radiation source (e.g., a laser light source) to form pockets. A temporary pattern in the dampening fluid is thereby formed over the non-patterned imaging blanket. Ink applied thereover is retained in the pockets formed by the removal of the dampening fluid. The inked surface is then brought into contact with a print substrate, and the ink transfers from the pockets in the dampening fluid layer to the print substrate. The dampening fluid may then be removed, a new uniform layer of dampening fluid applied to the imaging blanket, and the process repeated.

The imaging blanket comprises a low surface energy coating, for example a dispersion comprising fluorosilicone and infrared-absorbing fillers such as carbon black. This dispersion is typically applied as a wet film onto an engineered rubber substrate known as a "carcass" and then cured at a high temperature, such as at about 160° C. for about 4 hours, to yield the final imaging blanket. Carcasses, such as those manufactured from Trelleborg AB (Trelleborg, Sweden) typically contain reinforcing fabric layers, a compressible foam layer, and a top rubber layer. Such engineered carcasses may have poor thermal conductivity. Accordingly, repeat multiple image printing, especially of high solids areas, can lead to the image blanket heating up in an image area. For example, multiple revolutions of the drum during repeat printing may cause the temperature of the area where laser imaged on an imaging blanket surface to rise much higher than the non-image area. The higher temperature of the blanket surface in the image area may lead to abnormally low vapor deposition of the dampening fluid in that hot area. A lower level of dampening fluid in a hot area may in turn lead to the appearance image quality defects in prints, such as latent images, ghosting, and/or thermal blooming.

There is thus a need in the art for imaging blankets having improved thermal conductivity, such that the temperature of the imaging blanket does not increase by a detrimental amount.

SUMMARY

Disclosed herein is an imaging blanket for variable data lithography comprising (i) a substrate and (ii) a thermally-conductive composition disposed on the substrate comprising a silicone elastomer and a thermally-conductive filler, wherein the imaging blanket has a thermal conductivity ranging from about 0.5 W/(m·K) to about 10 W/(m·K), such as from about 0.5 W/(m·K) to about 5 W/(m·K) or from about 0.6 W/(m·K) to about 1.6 W/(m·K), and a Shore A hardness ranging from about 40 Shore A to about 100 Shore A. In certain embodiments, the thermally-conductive filler is chosen from metal oxides, such as iron oxide, aluminum oxide, magnesium oxide, zirconium oxide, and zinc oxide; aluminum nitride; boron nitride; carbon black; carbon nanotubes graphene; and mixtures thereof. In certain embodiments, the thermally conductive filler is chosen from aluminum oxide and boron nitride.

In certain embodiments, the at least one thermally-conductive filler is present in the thermally-conductive composition in an amount ranging from about 1% to about 15% by weight, such as about 1% to about 10% or about 2% to about 5%, based on the total weight of the thermally conductive composition, and in certain embodiments, the silicone elastomer is present in the thermally-conductive composition in an amount ranging from about 85% to about 99% by weight, such as about 90% to about 99% or about 95% to about 98%, based on the total weight of the thermally conductive composition.

In certain embodiments, the at thermally-conductive composition further comprises at least one catalyst, such as platinum, and in certain embodiments, the silicone elastomer is a room temperature vulcanization silicone rubber.

In certain embodiments, the thermally-conductive composition disposed on the substrate consists of a silicone elastomer, at least one thermally-conductive filler, and a catalyst.

In certain embodiments of the imaging blankets disclosed herein, the substrate comprises at least one material selected from the group consisting of metals, polyimides, plastic composites, and woven fabrics.

In further embodiments disclosed herein, the imaging blanket comprises a top coat comprising fluorosilicone and at least one infrared-absorbing filler, such as carbon black.

In various embodiments of the disclosure, the thermally-conductive composition has a Shore A hardness ranging from about 60 Shore A to about 80 Shore A. In certain embodiments, a temperature of the imaging blanket does not increase more than about 5° C., such as more than about 3° C., after about 20, about 30, about 40, or about 50 revolutions of the imaging blanket during printing. In certain embodiments, the temperature of the imaging blanket is below about 28° C., such as below about 27° C., below 26° C., or below about 25° C., after about 20, about 30, about 40, or about 50 revolutions of the imaging blanket during printing.

Also provided herein are methods of making an imaging blanket for variable data lithography comprising applying a thermally-conductive composition comprising a silicone elastomer and at least one thermally-conductive filler to a substrate; and curing the thermally-conductive composition on the substrate, wherein the thermally-conductive composition has a thermal conductivity ranging from 0.5 W/(m·K) to about 10 W/(m·K), such as from about 0.5 W/(m·K) to about 5 W/(m·K) or from about 0.6 W/(m·K) to about 1.6 W/(m·K), and a Shore A hardness ranging from about 40 Shore A to about 100 Shore A. In certain embodiments of the methods disclosed herein, curing the thermally-conductive composition occurs at room temperature, and in certain embodiments, curing the thermally-conductive composition occurs at an elevated temperature, such as from about 100° C. to about 200° C. In certain embodiments, the method further comprises applying a top coat to the cured thermally-conductive composition, and in certain embodiments, the top coat comprises a fluorosilicone and at least one infrared-absorbing filler, such as carbon black. In certain embodiments, the top coat may be cured, for example at a temperature greater than about 150° C., such as greater than about 155° C. or at about 160° C.

Also disclosed herein are methods of enhancing the thermal conductivity of an imaging blanket for variable data lithography, the method comprising coating the imaging blanket with a thermally-conductive composition comprising a silicone elastomer and at least one thermally-conductive filler; and curing the thermally-conductive composition on the substrate to create a coated imaging blanket, wherein the coated imaging blanket has a thermal conductivity ranging from 0.5 W/(m·K) to about 10 W/(m·K), such as from about 0.5 W/(m·K) to about 5 W/(m·K) or from about 0.6 W/(m·K) to about 1.6 W/(m·K), and a Shore A hardness ranging from about 40 Shore A to about 100 Shore A.

BRIEF DESCRIPTION OF THE DRAWINGS

The accompanying drawings, which are incorporated in and constitute a part of this specification, illustrate embodiments of the present teachings and together with the description, serve to explain the principles of the present teachings.

Figure 1:
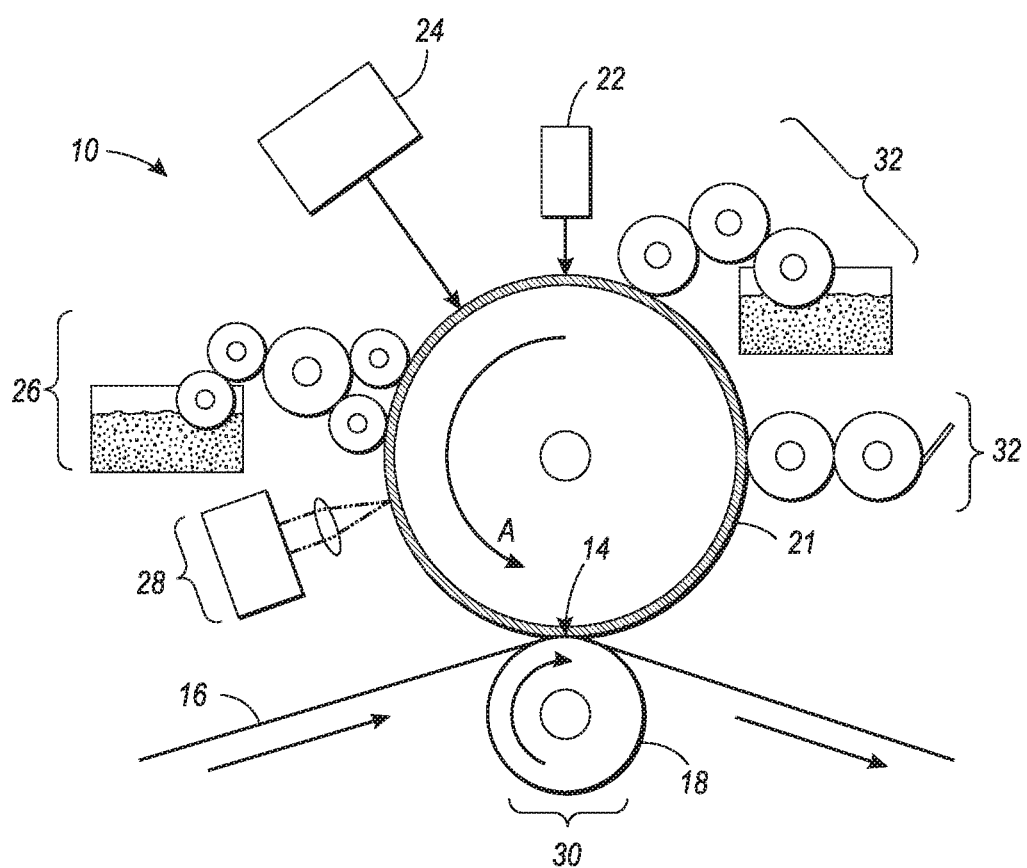
FIG. 1 is a side-view of a variable data lithography system according to various embodiments disclosed herein.

It should be noted that some details of the figures may have been simplified and are shown to facilitate understanding of the embodiments rather than to maintain strict structural accuracy, detail, and scale.

DESCRIPTION OF THE EMBODIMENTS

Reference will now be made in detail to embodiments of the present disclosure. The following description is merely exemplary.

In the following description, reference is made to the accompanying drawings that form a part thereof, and in which is shown by way of illustration specific exemplary embodiments in which the present teachings may be practiced. These embodiments are described in sufficient detail to enable those skilled in the art to practice the present teachings and it is to be understood that other embodiments may be utilized and that changes may be made without departing from the scope of the present teachings. The following description is, therefore, merely illustrative.

Although embodiments of the disclosure herein are not limited in this regard, the terms "plurality" and "a plurality" as used herein may include, for example, "multiple" or "two or more." The terms "plurality" or "a plurality" may be used throughout the specification to describe two or more components, devices, elements, units, parameters, or the like. For example, "a plurality of resistors" may include two or more resistors.

As used herein, the term "polyorganosiloxane" is used interchangeably with "siloxane," "silicone," "silicone oil," and "silicone rubber." Polyorganosiloxanes are well-understood to those of skill in the relevant art to refer to siloxanes having a backbone formed from silicon and oxygen atoms and sidechains containing carbon and hydrogen atoms. As used herein, the term "silicone" should also be understood to exclude siloxanes that contain fluorine atoms, while the term "fluorosilicone" is used to cover the class of siloxanes that contain fluorine atoms. Other atoms may be present in the silicone, for example, nitrogen atoms in amine groups which are used to link siloxane chains together during crosslinking.

The term "fluorosilicone" as used herein refers to polyorganosiloxanes having a backbone formed from silicon and oxygen atoms, and sidechains containing carbon, hydrogen, and fluorine atoms. At least one fluorine atom is present in the sidechain. The sidechains can be linear, branched, cyclic, or aromatic. The fluorosilicone may also contain functional groups, such as amino groups, which permit addition cross-linking. When the cross-linking is complete, such groups become part of the backbone of the overall fluorosilicone. The side chains of the polyorganosiloxane can also be alkyl or aryl. Fluorosilicones are commercially available, for example CF1-3510 from NuSil® or SLM (n-27) from Wacker.

The terms "media substrate," "print substrate," and "print media" generally refer to a usually flexible physical sheet of paper, polymer, Mylar® material, plastic, or other suitable physical print media substrate, sheets, webs, etc., for images, whether precut or web fed.

The term "printing device" or "printing system" as used herein refers to a digital copier or printer, scanner, image printing machine, xerographic device, electrostatographic device, digital production press, document processing system, image reproduction machine, bookmaking machine, facsimile machine, multi-function machine, or generally an apparatus useful in performing a print process or the like and can include several marking engines, feed mechanism, scanning assembly as well as other print media processing units, such as paper feeders, finishers, and the like. A "printing system" may handle sheets, webs, substrates, and the like. A printing system can place marks on any surface, and the like, and is any machine that reads marks on input sheets; or any combination of such machines.

As used herein, the term "ink-based digital printing" is used interchangeably with "variable data lithography printing" and "digital offset printing," and refers to lithographic printing of variable image data for producing images on a substrate that are changeable with each subsequent rendering of an image on the substrate in an image forming process. As used herein, "ink-based digital printing" includes offset printing of ink images using lithographic ink where the images are based on digital image data that may vary from image to image. As used herein, the ink-based digital printing may use a "digital architecture for lithographic ink" (DALI) or a variable data lithography printing system or a digital offset printing system, where the system is configured for lithographic printing using lithographic inks and based on digital image data, which may vary from one image to the next. As used herein, an ink-based digital printing system using DALI may be referred as a DALI printer. As used herein, an imaging member of a DALI printer may be referred to interchangeably as a DALI printing plate and a DALI imaging blanket.

All physical properties that are defined hereinafter are measured at 20° C. to 25° C. unless otherwise specified. The term "room temperature" refers to a temperature ranging from about 20° C. to about 25° C., such as about 25° C., unless otherwise specified.

Many of the examples mentioned herein are directed to an imaging blanket (including, for example, a printing sleeve, belt, imaging blanket employed on a drum, and the like) that has a uniformly grained and textured blanket surface that is ink-patterned for printing. Further examples of variable data lithographic printing are disclosed in U.S. Patent Application Publication No. 2012/0103212 A1 (the '212 publication) published May 3, 2012, and based on U.S. patent application Ser. No. 13/095,714, which is commonly assigned, and the disclosure of which is hereby incorporated by reference herein in its entirety.

FIG. 1 depicts an exemplary variable data lithography printing system 10. A general description of the exemplary system 10 shown in FIG. 1 is provided here. Additional details regarding individual components and/or subsystems shown in the exemplary system 10 of FIG. 1 may be found in the '212 publication. As shown in FIG. 1, the exemplary system 10 may include an imaging member 12 used to apply an inked image to a target image receiving media substrate 16 at a transfer nip 14. The transfer nip 14 is produced by an impression roller 18, as part of an image transfer mechanism 30, exerting pressure in the direction of the imaging member 12.

The imaging member 12 may include a reimageable surface layer (imaging blanket layer or carcass) formed over a structural mounting layer that may be, for example, a cylindrical core, or one or more structural layers over a cylindrical core. A fountain solution subsystem 20 may be provided generally comprising a series of rollers, which may be considered as dampening rollers or a dampening unit, for uniformly wetting the reimageable surface with a layer of dampening fluid or fountain solution, generally having a uniform thickness, to the reimageable surface of the imaging member 12. Once the dampening fluid or fountain solution is metered onto the reimageable surface, a thickness of the layer of dampening fluid or fountain solution may be measured using a sensor 22 that provides feedback to control the metering of the dampening fluid or fountain solution onto the reimageable surface.

An optical patterning subsystem 24 may be used to selectively form a latent image in the uniform fountain solution layer by image-wise patterning the fountain solution layer using, for example, laser energy. It is advantageous to form the reimageable surface of the imaging member 12 from materials that should ideally absorb most of the infrared or laser energy emitted from the optical patterning subsystem 24 close to the reimageable surface. Forming the surface of such materials may advantageously aid in substantially minimizing energy wasted in heating the fountain solution and coincidentally minimizing lateral spreading of heat in order to maintain a high spatial resolution capability. Briefly, the application of optical patterning energy from the optical patterning subsystem 24 results in selective evaporation of portions of the uniform layer of fountain solution in a manner that produces a latent image.

The patterned layer of fountain solution having a latent image over the reimageable surface of the imaging member 12 is then presented or introduced to an inker subsystem 26. The inker subsystem 26 is usable to apply a uniform layer of ink over the patterned layer of fountain solution and the reimageable surface of the imaging member 12. In embodiments, the inker subsystem 26 may use an anilox roller to meter an ink onto one or more ink forming rollers that are in contact with the reimageable surface of the imaging member 12. In other embodiments, the inker subsystem 26 may include other traditional elements such as a series of metering rollers to provide a precise feed rate of ink to the reimageable surface. Ink from the inker subsystem 26 may adhere to the areas of the reimageable surface that do not have fountain solution thereon to form an ink image, while ink deposited on the areas of the reimageable surface on which the fountain solution layer remains will not adhere to the reimageable surface.

Cohesiveness and viscosity of the ink residing on the reimageable plate surface may be modified by a number of mechanisms, including through the use of some manner of rheology control subsystem 28. In embodiments, the rheology control subsystem 28 may form a partial cross-linking core of the ink on the reimageable plate surface to, for example, increase ink cohesive strength relative to an adhesive strength of the ink to the reimageable plate surface. In embodiments, certain curing mechanisms may be employed. These curing mechanisms may include, for example, optical or photo curing, heat curing, drying, or various forms of chemical curing. Cooling may be used to modify rheology of the transferred ink as well via multiple physical, mechanical or chemical cooling mechanisms.

Substrate marking occurs as the ink is transferred from the reimageable surface of imaging member 12 to media substrate 16 using the transfer subsystem 30. With the adhesion and/or cohesion of the ink having been modified by the rheology control system 28, modified adhesion and/or cohesion of the ink causes the ink to transfer substantially completely, preferentially adhering to the media substrate 16 as it separates from the reimageable surface of the imaging member 12 at the transfer nip 14. Careful control of the temperature and pressure conditions at the transfer nip 14, among other things, may allow transfer efficiencies for the ink from the reimageable plate surface of the imaging member 12 to the media substrate 16 to exceed, for example, 95%. While it is possible that some fountain solution may also wet substrate 16, the volume of such transferred fountain solution will generally be minimal so as to rapidly evaporate or otherwise be absorbed by the substrate 16.

Finally, a cleaning system 32 is provided to remove residual products, including non-transferred residual ink and/or remaining fountain solution from the reimageable surface in a manner that is intended to prepare and condition the reimageable surface of the imaging member 12 to repeat the above cycle for image transfer. An air knife may be employed to remove residual fountain solution. It is anticipated, however, that some amount of ink residue may remain. Removal of such remaining ink residue may be accomplished by cleaning subsystem 32. The cleaning subsystem 32 may include, for example, at least a first cleaning member, such as a sticky or tacky member, in physical contact with the reimageable surface of the imaging member 12, where the sticky or tacky member removes residual ink and any remaining small amounts of surfactant compounds from the fountain solution of the reimageable surface of the imaging member 12. The sticky or tacky member may then be brought into contact with a smooth roller to which residual ink may be transferred from the sticky or tacky member, the ink being subsequently stripped from the smooth roller by, for example, a doctor blade. Any other suitable cleaning system can be employed.

Regardless of the type of cleaning system used, cleaning of the residual ink and fountain solution from the reimageable surface of the imaging member 12 can prevent or reduce the risk of a residual image from being printed in the proposed system. Once cleaned, the reimageable surface of the imaging member 12 is again presented to the fountain solution subsystem 20 by which a fresh layer of fountain solution is supplied to the reimageable surface of the imaging member 12, and the process is repeated.

Disclosed herein is a composition for use on an imaging blanket comprising a silicone elastomer and at least one thermally-conducting filler. The composition disclosed herein may have enhanced thermal conductivity and, when coated on a substrate, may provide an imaging blanket having enhanced thermal conductivity.

The silicone elastomer in the thermally-conductive composition disclosed herein may be any known silicone elastomer. For example, in certain embodiments the silicone elastomer may be a silicone rubber, such as room temperature vulcanization (RTV) silicone rubbers, high temperature vulcanization (HTV) silicone rubbers, and low temperature vulcanization (LTV) silicone rubbers. Such rubbers are known and readily available commercially, such as, for example, RT 622 silicone from Wacker Chemical Corporation; Silastic® 735 black RTV and Silastic® 732 RTV, both from Dow Corning; 106 RTV Silicone Rubber and 90 RTV Silicone Rubber, both from General Electric; and JCR6115Clear HTV and SE4705U HTV silicone rubbers, both from Dow Corning Toray Silicones. In certain embodiments, the silicone elastomer is an RTV silicone rubber. The silicone elastomer may be present in the composition in any amount sufficient to provide the thermally-conductive composition disclosed herein. For example, in certain embodiments, the silicone elastomer is present in the composition in an amount ranging from about 85% to about 99% by weight, such as about 90% to about 99% or about 95% to about 98%.

In certain embodiments, the at least one thermally-conductive filler in the thermally-conductive compositions disclosed herein may be chosen from metal oxides, such as iron oxide, aluminum oxide, magnesium oxide, zirconium oxide, and zinc oxide; aluminum nitride; boron nitride; carbon black; carbon nanotubes graphene; and mixtures thereof. In certain embodiments, the at least one thermally-conductive filler is chosen from aluminum oxide and boron nitride. In certain embodiments, the at least one thermally-conductive filler is chosen from iron oxide and aluminum oxide. In certain embodiments, the at least one thermally-conductive filler may be present in the composition in an amount ranging from about 1% to about 15% by weight of the total weight of the silicon elastomer composition, such as from about 1% to 10% or about 2% to about 5%.

Further disclosed herein is a method of making an imaging blanket having improved thermal conductivity. In certain embodiments, the method comprises coating the thermally-conductive composition disclosed herein on a substrate to form the improved thermal imaging blanket. The substrates disclosed herein can be rolls, belts, or plates mounted to rolls, as is well-known in the art. The substrate can be made of any suitable material, such as, for example, polymers such as polyimide; silicone or biaxially-oriented polyethylene terephthalate (e.g., Mylar®); metals such as nickel, aluminum, or aluminum alloys; woven fabric; quartz; plastic composites; or combinations thereof. The thermally-conductive composition disclosed herein may be coated on the substrate by any method known in the art, such as by flow coating or ribbon flow coating. After coating, the thermally-conductive composition may be cured on the substrate. In certain embodiments, the composition is cured on the substrate at room temperature, such as at a temperature ranging from about 20° C. to about 25° C. In certain embodiments, the thermally-conductive composition disclosed herein may be cured by the addition of a catalyst, such as a platinum catalyst or a tin catalyst.

The thermally-conductive composition disclosed herein may be coated on the substrate in any thickness appropriate for the desired application, such as a variable data lithography printing application. In certain embodiments, the thickness of the thermally-conductive composition coating on the substrate may range from about 0.1 mm to about 1.5 mm, such as from about 0.25 mm to about 1.0 mm, about 0.5 mm to about 0.75 mm, or, in certain embodiments, a thickness of about 0.5 mm.

As disclosed herein, the imaging blankets coated with the thermally-conductive composition disclosed herein may demonstrate enhanced thermal conductivity. This enhanced thermal conductivity may be observed even though the imaging blanket maintains a desired hardness. For example, in certain embodiments, the Shore A hardness of the thermally-conductive composition disclosed herein may range from about 40 Shore A to about 100 Shore A, such as from about 55 Shore A to about 90 Shore A or from about 60 Shore A to about 80 Shore A. The hardness of the silicone elastomer composition may be measured by any means known in the art, such as with a Shore A durometer dial.

In certain exemplary embodiments, the thermal conductivity of the thermally-conductive composition or the imaging blanket that has been coated with a thermally-conductive composition as disclosed herein may range from about 0.5 W/(m·K) to about 10 W/(m·K), such as from about 0.5 W/(m·K) to about 5 W/(m·K) or from about 0.6 W/(m·K) to about 1.6 W/(m·K). Thermal conductivity may be measured by any means known in the art. For example, in certain embodiments, thermal conductivity may be measured using the flash method, wherein a sample may be heated by a short light pulse and the resulting temperature increase measured using an infrared detector. In certain embodiments, thermal conductivity may be measured using, for example, an LFA 447 NanoFlash® from Netzsch Group.

In certain embodiments disclosed herein, the imaging blanket disclosed herein that has been coated with a thermally-conductive composition may further comprise a top coat composition, for example a dispersion comprising fluorosilicone and at least one infrared-absorbing filler. The infrared-absorbing filler is able to absorb energy from the infra-red portion of the spectrum (having a wavelength of from about 750 nm to about 1000 nm). This may aid in efficient evaporation of a fountain solution. In certain embodiments, the at least one infrared-absorbing filler may be chosen from carbon black, a metal oxide such as iron oxide, carbon nanotubes, graphene, graphite, or carbon fibers. The at least one infrared-absorbing filler may have an average particle size of from about 2 nanometers to about 10 microns. In certain embodiments, the at least one infrared-absorbing filler may be present in the top coat composition in an amount ranging from about 5% to about 20% by weight based on the total weight of the top coat composition, such as from about 7% to about 17% or from about 10% to about 15%.

In certain embodiments, the top coat composition may comprise additional ingredients in addition to the fluorosilicone and the at least one infrared-absorbing filler, such as, for example, additional fillers. In certain embodiments, an additional filler may be silica. Silica can help increase the tensile strength of the top coat and increase wear resistance. Silica may be present in an amount ranging from about 1% to about 30% by weight based on the total weight of the top coat composition, such as from about 1% to about 5%, about 5% to about 30%, or from about 10% to about 25%. The silica may have an average particle size ranging from about 10 nm to about 0.2 μm, such as from about 50 nm to about 0.1 μm or about 20 nm.

When coated on the imaging blanket, the top coat composition may have a thickness ranging from about 0.5 μm to about 4 mm, depending on the requirements of the overall printing system. In certain embodiments, the top coat composition may be applied to the imaging blanket coated with the thermally-conductive composition disclosed herein and then cured. The curing may be performed at an elevated temperature, such as a temperature ranging from about 135° C. to about 165° C., such as about 160° C. This elevated temperature is in contrast to room temperature. The curing may occur for a time period of from about 15 minutes to about 5 hours, such as about 1 hour to about 4 hours or from about 2 hours to about 3 hours. In certain embodiments, the curing may occur at about 160° C. for about 4 hours. The top coat composition may further comprise a catalyst, such as a platinum catalyst.

In certain embodiments disclosed herein, the imaging blanket comprising a thermally-conductive composition as disclosed herein may have improved thermal conductivity when compared to a traditional imaging blanket, such as an imaging blanket comprising fabric layers, compressible foam layers, and/or rubber layers. In certain embodiments, the imaging blanket as disclosed herein may show improved thermal conductivity in that during printing, after at least about 10 revolutions, such as after at least about 20 revolutions, at least about 30 revolutions, at least about 40 revolutions, or at least about 50 revolutions, the imaging blanket has a temperature of less than about 29° C., such as less than about 28° C., less than about 27° C., less than about 26° C., or less than about 25° C., such as a between about 24° C. and about 25° C. In certain embodiments, the imaging blanket as disclosed herein may show improved thermal conductivity in that during printing after at least about 10 revolutions, such as after at least about 20 revolutions, at least about 30 revolutions, at least about 40 revolutions, or at least about 50 revolutions, the imaging blanket increases in temperature from its starting temperature (i.e., 0 revolutions) by less than about 9° C., such as less than about 8° C., less than about 7° C., less than about 6° C., less than about 5° C., less than about 4° C., less than about 3° C., or by about 3° C.

Further disclosed herein are processes for variable data lithographic printing. In certain embodiments, the process comprises applying a fountain solution to an imaging member comprising a thermally-conductive composition as disclosed herein; evaporating the fountain solution from selective locations on the imaging member surface to form non-image areas and image areas, which form a latent image; developing the latent image by applying an ink composition to the image areas; and transferring the developed latent image to a receiving substrate. In certain embodiments, the imaging blanket may further comprise a top coat, such as a top coat comprising a fluorosilicone and at least one infrared-absorbing filler such as carbon black.

Notwithstanding that the numerical ranges and parameters setting forth the broad scope of the disclosure are approximations, the numerical values set forth in the specific examples are reported as precisely as possible. Any numerical value, however, inherently contains certain errors necessarily resulting from the standard deviation found in their respective testing measurements. Moreover, all ranges disclosed herein are to be understood to encompass any and all sub-ranges subsumed therein.

While the present teachings have been illustrated with respect to one or more implementations, alterations and/or modifications can be made to the illustrated examples without departing from the spirit and scope of the appended claims. In addition, while a particular feature of the present teachings may have been disclosed with respect to only one of several implementations, such feature may be combined with one or more other features of the other implementations as may be desired and advantageous for any given or particular function. Furthermore, to the extent that the terms "including," "includes," "having," "has," "with," or variants thereof are used in either the detailed description and the claims, such terms are intended to be inclusive in a manner similar to the term "comprising." Further, in the discussion and claims herein, the term "about" indicates that the value listed may be somewhat altered, as long as the alteration does not result in nonconformance of the process or structure to the illustrated embodiment. Finally, "exemplary" indicates the description is used as an example, rather than implying that it is an ideal.

It will be appreciated that variants of the above-disclosed and other features and functions, or alternatives thereof, may be combined into many other different systems or applications. Various presently unforeseen or unanticipated alternatives, modifications, variations, or improvements therein may be subsequently made by those skilled in the art which are also intended to be encompasses by the following claims.

EXAMPLES

The following Examples are being submitted to further define various species of the present disclosure. These Examples are intended to be illustrative only and are not intended to limit the scope of the present disclosure. Parts and percentages are by weight unless otherwise indicated.

Example 1

A test carcass was constructed comprising a silicone elastomer having thermally conductive fillers. To construct the carcass, thermally-conductive fillers were dispersed into a room-temperature polydimethylsiloxane-based vulcanizing RTV silicone formulation, and the resulting dispersion was coated onto a nickel sleeve and cured using a platinum catalyst at range of about 100° C. to about 200° C. for 1-4 hours to yield the carcass. The carcass was then coated with a fluorosilicone/carbon black topcoat. The thickness of the layer of silicone elastomer with thermally-conductive fillers cured on the sleeve was 1.0 mm, and it was measured to have a Shore A hardness of 80 Shore A, with a thermal conductivity of about 0.78 W/(m·K). Shore hardness was measured using a Shore Dial Durometer from Instron®.

A control carcass was provided by Trelleborg AB. The control carcass was a multilayer carcass comprising a bottom, center, and top fabric layer. The control carcass was coated with the same fluorosilicone/carbon black topcoat as the test carcass.

Figure 2:
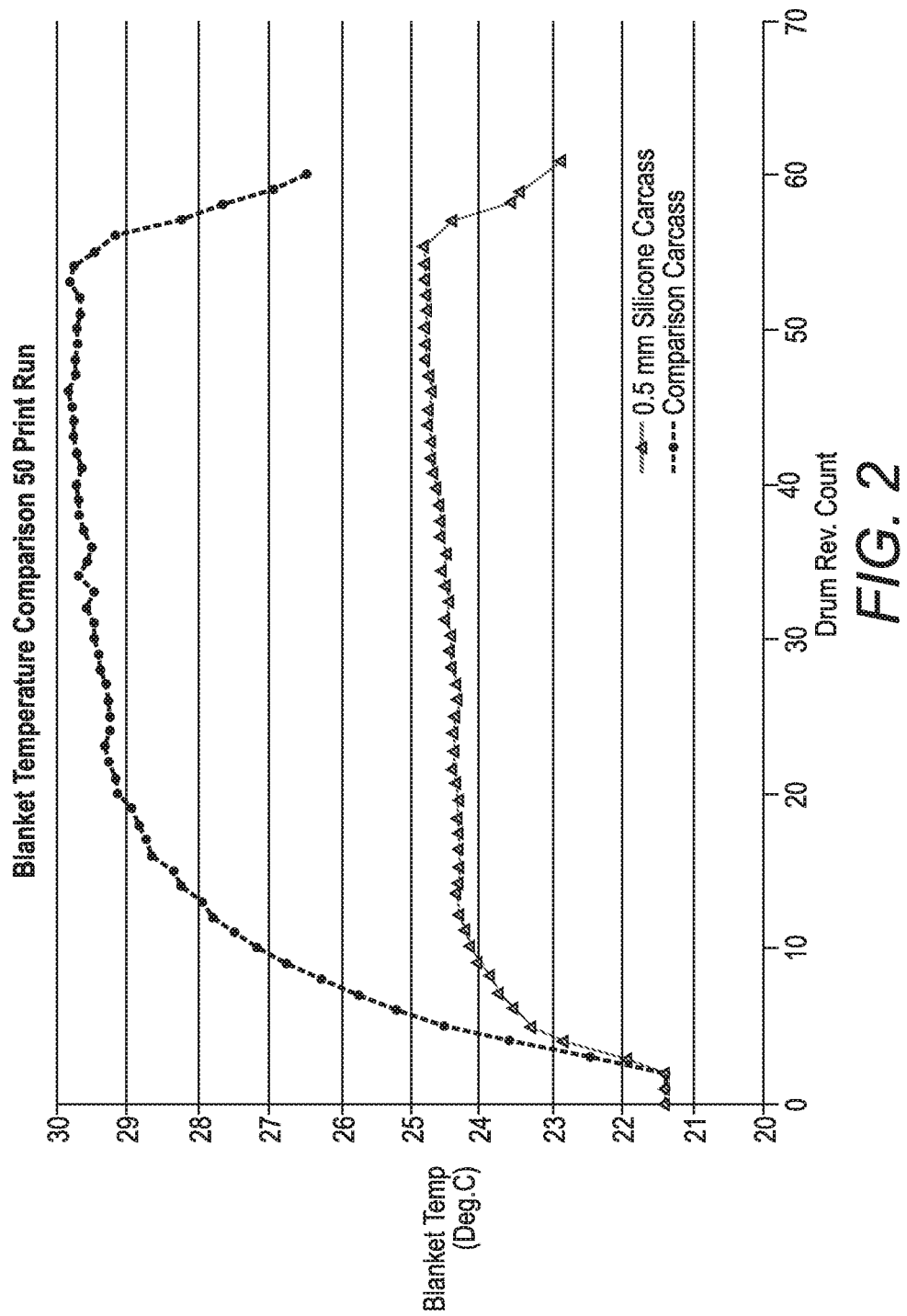
FIG. 2 is a graph showing the temperatures of a control carcass and a 0.5 mm silicone-coated carcass over multiple print revolutions.

The carcasses were evaluated on a printer using the Dali technology. Repeat images were printed, and the temperature of the imaging blanket surface in the print patch area where the image was generated after the ink was transferred to the paper was recorded using a non-contact infrared thermometer from Fluke®. As shown in FIG. 2, for the carcass coated with a composition comprising a silicone elastomer and at least one thermally-conductive filler, repeat printing caused the temperature of print patch area where it was laser imaged to rise up about 3° C. from its starting temperature (e.g., from about 21.4° C. to about 24.3° C.) over the non-image area after about 20 revolutions of the drum.

In contrast, for the Trelleborg control carcass, repeat printing caused the temperature of the print patch area where it was laser imaged to rise up about 8° C. (e.g., from about 21.4° C. to about 29.1° C.) over the non-image area after about 20 revolutions of the drum. Table 1 below shows the temperature measured in each carcass after approximate revolutions of the drum. As shown in Table 1 and FIG. 2, approximately a three-fold improvement over the Trelleborg control carcass was observed.

TABLE 1

Carcass Temperature After Multiple Drum Revolutions

| No. of drum revolutions | Temperature (° C.) Thermally-conductive carcass | Temperature (° C.) Carcass with no thermally-conductive composition coating |
|---|---|---|
| 0 | 21.4 | 21.4 |
| 5 | 23.3 | 24.5 |
| 10 | 24.1 | 27.1 |
| 15 | 24.3 | 28.3 |
| 20 | 24.3 | 29.1 |
| 25 | 24.3 | 29.2 |
| 30 | 24.4 | 29.4 |
| 35 | 24.5 | 29.6 |
| 40 | 24.6 | 29.7 |
| 45 | 24.7 | 29.8 |
| 50 | 24.8 | 29.7 |

What is claimed is:

1. An imaging blanket for variable data lithography comprising:
   a substrate; and
   a thermally-conductive composition comprising a silicone elastomer and at least one thermally-conductive filler disposed on the substrate, and
   a top coat comprising fluorosilicone and at least one infrared-absorbing filler,
   wherein the thermally-conductive composition has a thermal conductivity ranging from 0.6 W/(m·K) to about 1.6 W/(m·K) and a Shore A hardness ranging from about 40 Shore A to about 100 Shore A,
   wherein the at least one thermally-conductive filler is present in the thermally-conductive composition in an amount ranging from about 1% to about 15% by weight, based on the total weight of the thermally-conductive composition, and
   wherein the silicone elastomer is a room temperature vulcanization silicone rubber.

2. The imaging blanket of claim 1, wherein the at least one thermally-conductive filler is selected from the group consisting of boron nitride and aluminum oxide.

3. The imaging blanket of claim 1, wherein the at least one thermally-conductive filler is present in the thermally-conductive composition in an amount ranging from about 5% to about 10% by weight, based on the total weight of the thermally-conductive composition.

4. The imaging blanket of claim 1, wherein the substrate comprises at least one material selected from the group consisting of metals, polyimides, plastic composites, and woven fabrics.

5. The imaging blanket of claim 1, wherein the at least one infrared-absorbing filler is carbon black.

6. The imaging blanket of claim 1, wherein the thermally-conductive composition has a thermal conductivity ranging from 0.6 W/(m·K) to about 0.8 W/(m·K).

7. The imaging blanket of claim 1, wherein the thermally-conductive composition has a Shore A hardness ranging from about 60 Shore A to about 80 Shore A.

8. The imaging blanket of claim 1, wherein the thermally-conductive composition further comprises at least one catalyst.

9. The imaging blanket of claim 8, wherein the at least one catalyst is a platinum catalyst.

10. The imaging blanket of claim 1, wherein a temperature of the imaging blanket does not increase more than about 5° C. after about 20 revolutions of the imaging blanket during printing.

11. The imaging blanket of claim 1, wherein a temperature of the imaging blanket does not increase more than about 3° C. after about 20 revolutions of the imaging blanket during printing.

12. The imaging blanket of claim 1, wherein the temperature of the imaging blanket is below about 28° C. after about 20 revolutions of the imaging blanket during printing.

13. A method of making an imaging blanket for variable data lithography, the method comprising:
   applying a thermally-conductive composition comprising a silicone elastomer and at least one thermally-conductive filler to a substrate;
   curing the thermally-conductive composition on the substrate,
   applying a top coat comprising fluorosilicone and at least one infrared-absorbing filler to the imaging blanket, and
   curing the top coat,
   wherein the thermally-conductive composition has a thermal conductivity ranging from 0.6 W/(m·K) to about 1.6 W/(m·K) and a Shore A hardness ranging from about 40 Shore A to about 100 Shore A,
   wherein the at least one thermally-conductive filler is present in the thermally-conductive composition in an amount ranging from about 1% to about 15% by weight, based on the total weight of the thermally-conductive composition, and
   wherein the silicone elastomer is a room temperature vulcanization silicone rubber.

14. The method of claim 13, wherein curing the thermally-conductive composition occurs at room temperature.

15. The method of claim 13, wherein the imaging blanket has a thermal conductivity ranging from 0.6 W/(m·K) to about 0.8 W/(m·K).

16. A method of enhancing the thermal conductivity of an imaging blanket for variable data lithography, the method comprising:
   coating the imaging blanket with a thermally-conductive composition comprising a silicone elastomer and at least one thermally-conductive filler;
   curing the thermally-conductive composition on a substrate to create a coated imaging blanket,
   applying a top coat comprising fluorosilicone and at least one infrared-absorbing filler to the imaging blanket, and
   curing the top coat,
   wherein the coated imaging blanket has a thermal conductivity ranging from 0.6 W/(m·K) to about 1.6 W/(m·K) and a Shore A hardness ranging from about 40 Shore A to about 100 Shore A, wherein the at least one thermally-conductive filler is present in the thermally-conductive composition in an amount ranging from about 1% to about 15% by weight, based on the total weight of the thermally-conductive composition, and wherein the silicone elastomer is a room temperature vulcanization silicone rubber.

\* \* \* \* \*